United States Patent [19]
Burrows et al.

[11] Patent Number: 5,714,773
[45] Date of Patent: Feb. 3, 1998

[54] PHOTODIODE ARRAY FOR REMOTELY POWERED LIGHTWAVE NETWORKS

[75] Inventors: Ellsworth C. Burrows, Woodbridge; Andrew Gomperz Dentai, Atlantic Highlands; Clinton Randy Giles, Morganville, all of N.J.

[73] Assignee: Lucent Technologies Inc., Murray Hill, N.J.

[21] Appl. No.: 729,884

[22] Filed: Oct. 15, 1996

[51] Int. Cl.⁶ .................. H01L 27/15; H01L 31/12; H01L 33/00
[52] U.S. Cl. .................. 257/82; 385/49; 359/173; 359/195; 257/98; 257/432; 257/446; 257/448; 257/465; 257/458
[58] Field of Search .................. 257/443, 465, 257/448, 446, 458, 98, 82, 81, 80, 466, 432; 385/49; 359/195, 173

[56] References Cited

U.S. PATENT DOCUMENTS 3,293,440  12/1966  Mueller .................. 257/466 X
4,366,377  12/1982  Notthoff et al. .................. 257/446 X
4,514,860  4/1985  Adolfsson et al. .................. 359/173 X
5,424,864  6/1995  Emura .................. 359/173

FOREIGN PATENT DOCUMENTS

1257377  10/1989  Japan .................. 257/82
6021504  1/1994  Japan .................. 257/465

*Primary Examiner*—William Mintel

[57] ABSTRACT

The specification describes lightwave systems with remotely powered photoelectric generators. Optical power transmitted through the fiber is incident on a remotely located photodiode array. High power conversion efficiency coupled with a specially designed diode array generates sufficient power to operate electromechanical or electrooptic apparatus in the remote station. Long wavelength photodiodes are serially connected to increase the voltage to practical operating levels. In a communication system, with an optical signal transmitted with the optical power, multiplexers are used for separating the optical power from the optical signal. Also disclosed are optimally designed photodetector arrays in which the photodetector elements are segments of a circular or polygonal circularly symmetric array to increase the fill factor of the array.

18 Claims, 10 Drawing Sheets

PHOTODIODE ARRAY FOR REMOTELY POWERED LIGHTWAVE NETWORKS

FIELD OF THE INVENTION

This invention relates to micropower generators that are particularly adapted for powering remote devices in lightwave networks. The generators use light propagated through an optical fiber to power the generator. The photoelectric converters are diode arrays.

BACKGROUND OF THE INVENTION

In the early development of optical fibers, communications system designers proposed to power subscriber equipment using light propagated through the fiber. This remote powering scheme was thought to be an added attraction to lightwave communications, and would open new communications service opportunities. As the system designers and device designers explored this new possibility it was quickly discovered that the devices to enable the development to proceed were not available. The optical power density in a typical optical fiber transmission system was simply too low for practical power levels to be realized at the remote end. The best they could do was to transmit telemetry signals to equipment powered at the subscriber location. The telemetry signals could be multiplexed with data and voice information, so intelligent systems with considerable versatility could be and have been designed and implemented. In some cases these systems are remotely powered electrically, and others are optically powered at the remote location using photoelectric generators. But the goal of optically controlling mechanical or electrooptic functions at a remote location using power from the optical fiber has consistently been found impractical, and remains an essentially abandoned technology.

SUMMARY OF THE INVENTION

As a result of new approaches to system integration, and re-evaluations of past conceptions in this heretofore unsuccessful technology, we have discovered that unexpectedly high levels of power can be realized at remote lightwave stations. For example, these levels are sufficient to power optical switches, attenuators and filters using remote commands to reconfigure nodes in a communication network.

One of the limitations recognized in the prior art is that the beam size corresponding to a typical fiber core diameter limits the amount of optical power that can be propagated through an optical fiber waveguide to a value previously thought too small for practical photoelectric power generation. We have found that using relatively long wavelength laser diodes, the power conversion efficiency can be made very high. Use of these diode devices for this application has been discouraged by the fact that typically the light absorbing layer of these devices has a narrow bandgap, and thus the photodiodes yield power at a fraction of a volt. We have overcome this limitation by constructing a photodiode array, with the diodes interconnected in series. This technique enables power generation at voltage levels well in excess of one volt, i.e. voltage levels required by typical electromechanical or electrooptic equipment. Combining one or more of these expedients provides practical remote power generation in a lightwave system.

We have also designed photodiode arrays that efficiently capture the available power in the optical beam from the fiber. These arrays are optimized for uniform levels of photogenerated current from individual elements of the array as well as for fill factor.

DETAILED DESCRIPTION

Figure 1:
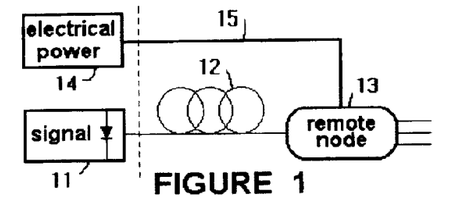
FIGS. 1–5 are schematic illustrations of several options for providing power to a remote station.

Referring to FIGS. 1–5 several alternatives to remotely powering electromecanical or electrooptic devices are illustrated schematically. In FIG. 1, optical signal 11, typically from a modulated laser source, is transmitted over a length of optical fiber cable 12 to remote station 13. Electrical power is supplied to the remote station from power source 14 over a length of electrical power cable typically corresponding to fiber cable 12.

In the figures the convention followed for illustrating the electrical and optical paths is to show the electrical wire or cable as a thicker line to distinguish from the characteristically thinner optical fiber or optical cable.

Figure 2:
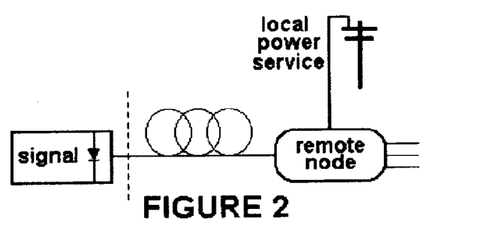

In FIG. 2 the remote electrical power is replaced by local power as shown. It will be recognized by those skilled in the art that many applications in which power at the remote station is desired either do not have local power available, or it is not cost effective, or will not be found cost effective in view of the invention described here.

Figure 3:
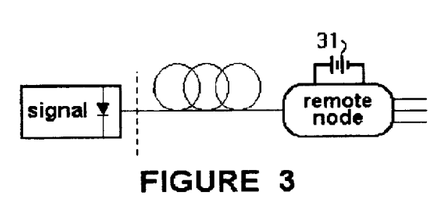

In FIG. 3 the remote power is provided by battery 31. Systems are in wide use that employ batteries at a remote station, and many also have means for charging the batteries from photodiode arrays (not shown in the figure) at the remote location.

Figure 4:
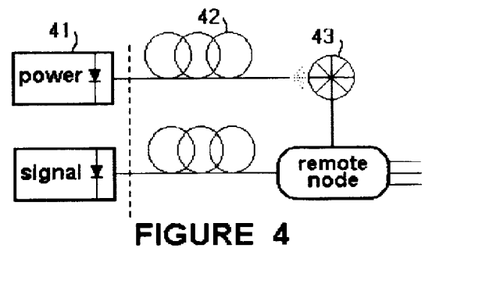
Figure 5:
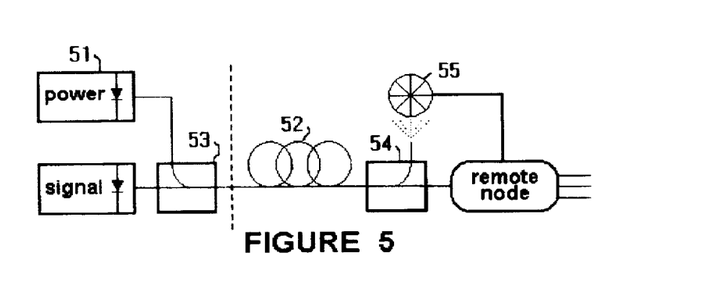

The options that are addressed with this invention are shown in FIGS. 4 and 5 wherein an optical power source, 41, 51, is located at the sending station with the optical signal. In FIG. 4 the optical power is transmitted over a separate optical fiber 42 with the output end of that fiber incident on the remote power generator 43. In FIG. 5 the optical power is transmitted over the same fiber 52 as the optical signal using multiplexer 53 to combine the signals. Light for the power generator is separated from the signal at demultiplexer 54 and is focused on the detector array 55 to power equipment at the remote node.

The generators 43 and 55 of FIGS. 4 and 5 are arrays of photodiodes. The characteristics of the arrays are an important aspect of the invention.

Figure 6:
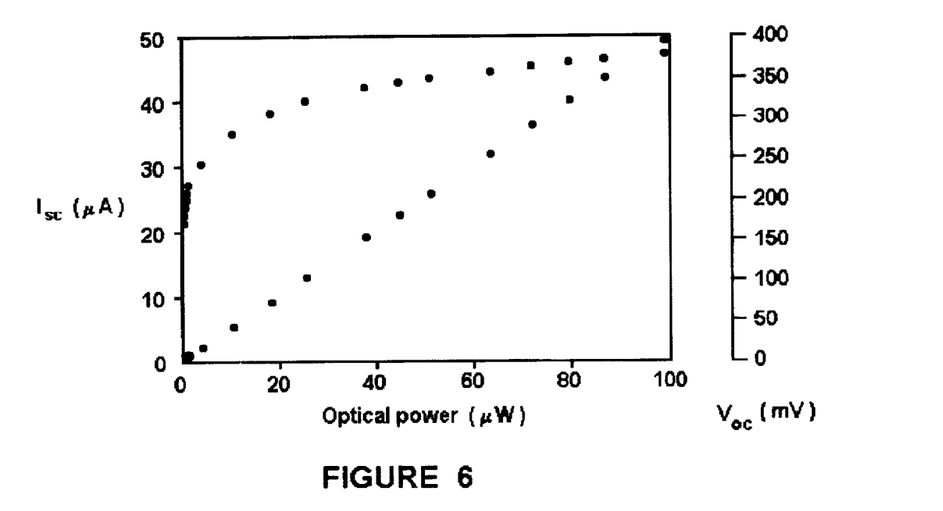
FIG. 6 is a plot of short circuit photocurrent vs. incident optical power level for a single photodiode used to demonstrate the invention.
Figure 7:
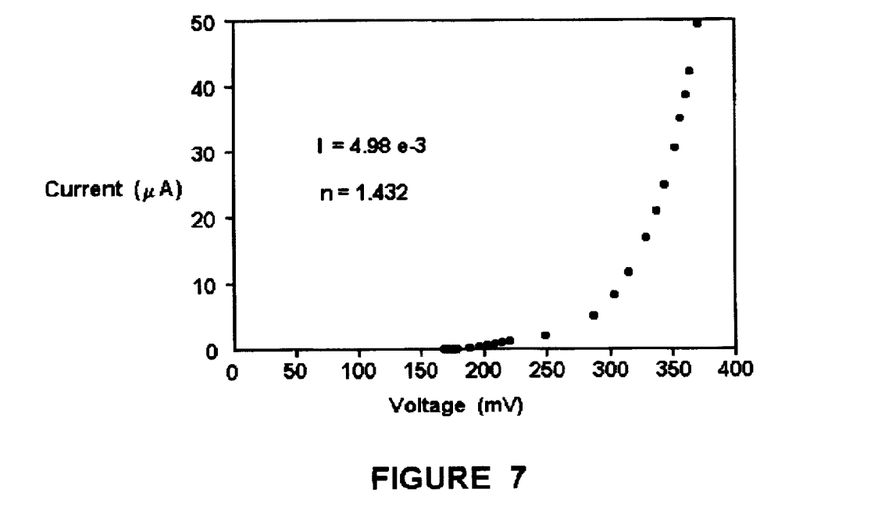
FIG. 7 is a current voltage characteristic of the photodiode of FIG. 6 showing the open circuit voltage and its limitations for practical applications.

Referring to FIGS. 6 and 7, the electrical characteristics of a typical long wavelength single photodiode are shown. The diode is an InGaAs photodiode grown by low- pressure MOVPE on n-type substrates. The InGaAs absorbing layer was ~0.5 μm thick and the p-n heterojunction was formed by growth of an ~1 μm thick p-type InP layer. Mesas 200 μm square were formed on 360 μm square chips by chemical etching, and metal contacts were applied using conventional processing technology. The measured short-circuit photocurrent, $I_{SC}$, and the open circuit voltage, $V_{OC}$, of a single photodetector with 1550 nm illumination is shown in FIG. 6. The current voltage characteristic of the single diode is shown in FIG. 6. From these measurements, the estimated responsivity was η=0.49 A/W at 1550 nm. The inferred I-V characteristic is described by a simple diode model (including recombination):

$$I_d = 5.0 \times 10{-9} \left( \exp\left( \frac{V_d}{nkT} \right) - 1 \right)$$

where $V_d$ is the applied voltage, n=1.43 is a nonideality parameter and kT=28 mV. The responsivity and I-V expression were used in a SPICE circuit model of the photogenerator to analyze its performance and use in electronic circuits. From FIG. 6 it is evident that the open circuit voltage of the otherwise high efficiency photodetector is low, a factor that discourages design of remote powered generators in lightwave systems.

Figure 8:
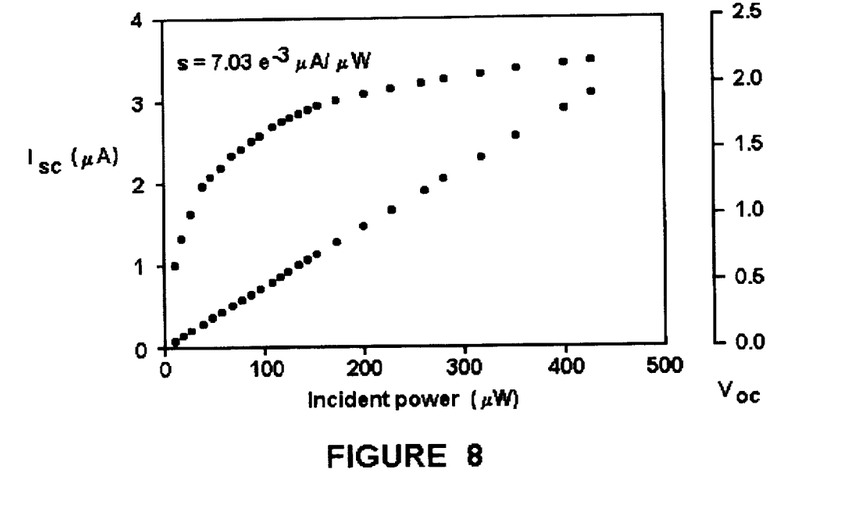
FIGS. 8 and 9 are plots corresponding to those of FIGS. 6 and 7 for an array of photodiodes serially connected according to the invention.
Figure 9:
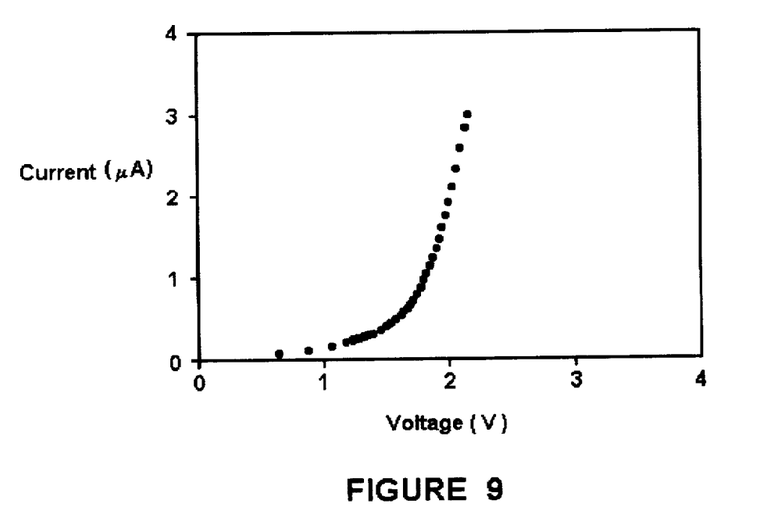

To overcome the voltage limitation, we arranged nine photodiodes in a 3×3 array, and serially interconnected them using gold wire. The diodes were spaced 60–80 microns apart on an insulated substrate. An electrical analysis similar to the above was conducted for the 3×3 array. The measured short-circuit photocurrent, $I_{SC}$, and open-circuit voltage, $V_{OC}$, for the array is shown in FIG. 8. The I-V characteristic of the array is shown in FIG. 9. The voltage produced by the array is well within the range at which many useful electromechanical and electrooptic apparatus operate. There are useful devices that operate with voltages as small as 0.8 volts.

The conversion efficiency of the photogenerator array that we used in this demonstration was low because of the small fill-factor resulting from the spaces between the active photodetector regions. Additionally, the short-circuit current of the array, $I_{SC}$ (array), was limited to the $I_{SC}$ of the photodetectors in the corners of the square array. These corner detectors received the least optical power when the photogenerator was illuminated with the circular shaped beam from a single mode fiber. Assuming a gaussian profile beam at the output of a single mode fiber, i.e.:

$$i = \frac{1}{\pi \omega_o^2} \exp\left( \frac{-r^2}{\omega_o^2} \right)$$

where r is the radial position and $\omega_o$ is the spot size, the optimum $\omega_o$ equals $D_{array}/2$ where $D_{array}$ is the largest spacing between any two detectors of the array. For our device, $D_{array}$ was 1.22 mm, the diagonal length between the two corners. Integrating the light intensity over a corner photodetector yielded F=0.0127, the fraction of the power intercepted by it. The photocurrent efficiency of the array is then predicted to be $\eta_{array}$=Fη=6.2×10$^{-3}$ A/W. FIG. 8 gives a measured efficiency of approximately 7.0×10$^{-3}$ A/W. The difference from the predicted value is small and may have resulted from variation in detector responsivity and deviation of the optical mode profile from gaussian.

Figure 10:
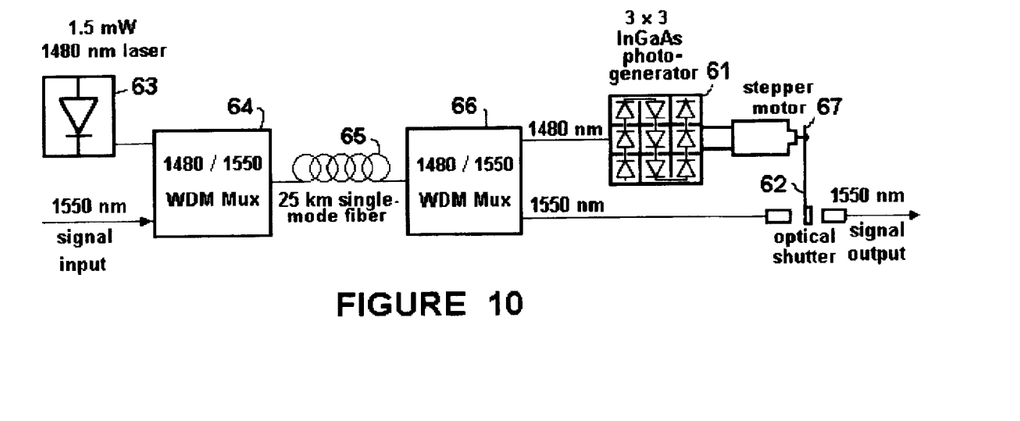
FIG. 10 is a schematic diagram of a remotely powered lightwave system built with the diode array described in connection with FIGS. 8 and 9 to demonstrate the principles of the invention.

Use of the InGaAs photogenerator in a communications system was demonstrated in the configuration shown in FIG. 10, where the photogenerator 61 provided electrical power to operate a remote optical shutter 62 in the signal path. Such a remote service interruption capability may be useful in some optical networks and, with modifications, other network functions, including optical switching and remote add/drop reconfigurations, as will be described later.

In the system of FIG. 10, optical power from a 1.5 mW 1480 nm semiconductor laser 63 was launched through a coarse 1480 nm/1550 nm WDM multiplexer 64 into 25 km of single-mode fiber 65. A second WDM multiplexer 66 at the output of the transmission fiber separated the 1480 nm light from the 1550 nm signal path. The 1480 nm output illuminated the 3×3 photogenerator array 61, which was connected to a micro-power stepper motor circuit 67 that operated the optical shutter 62.

The system of FIG. 10, used to demonstrate the invention, employed two optical wavelengths to show the compatibility of the power generator with typical optical signals. The signal path is optional in the invention. The optical power source for the generator can be used alone, in which case the multiplexers are omitted. However, typically the utility of remote optical power generators resides where there is an optical fiber in place or to be placed for standard lightwave communications. The multiplexers can also be omitted if the system is designed for a separate optical fiber for the power light as shown in FIG. 4.

Figure 11:
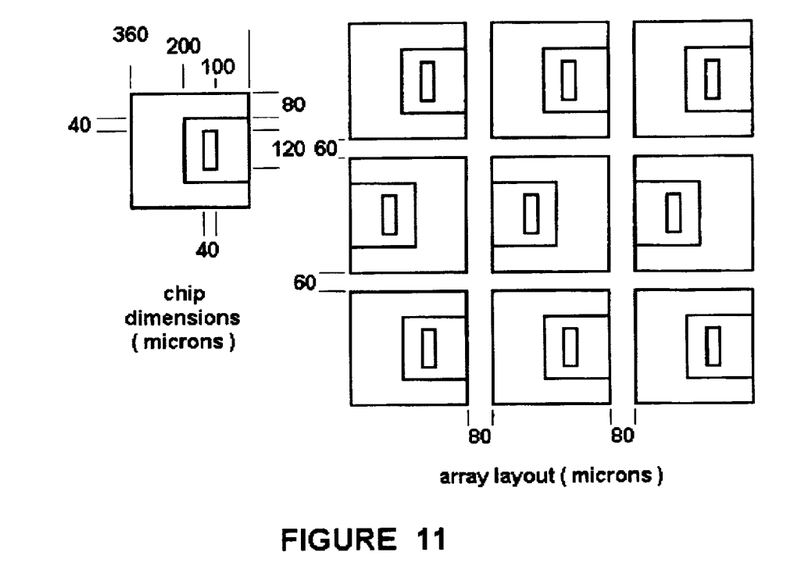
FIG. 11 is a diagram showing the dimensions of the individual diodes in the diode array, and the overall array dimensions.

The dimensions of the individual diodes in the photodiode array 61, and the overall array dimensions are shown in FIG. 11. The large rectangle, 68, is the overall chip which was 360 microns square. The active area 69 is the junction area and was 200 microns square. The bonding pad 70 was 40 microns by 120 microns in area. The array was interconnected serially by wire bonds (not shown) to the bonding pads 70. The active area of these photodiodes was less than 30% of the total chip area and it should be evident that little effort was made in this demonstration to optimize the fill factor for the array.

Figure 12:
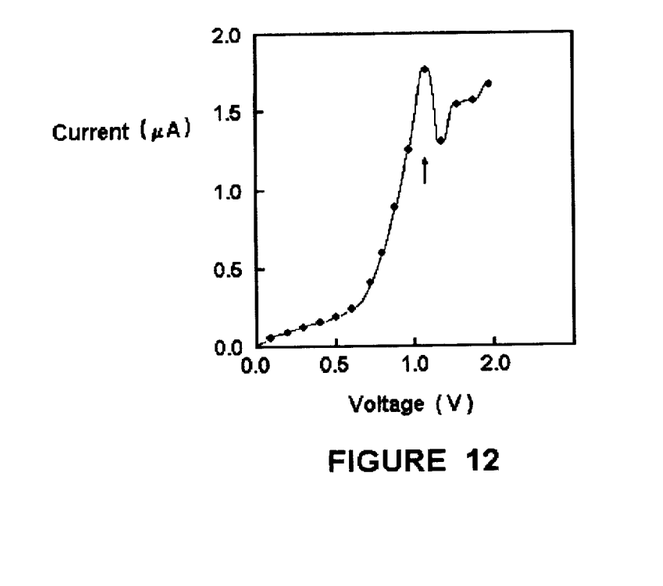
FIG. 12 is a current voltage characteristic for the system of FIG. 10.

FIG. 12 shows the I-V characteristic of the photogenerator 61. The 1550 nm signal path was connected to a fiber optic beam expander where shutter 62, controlled by the stepper motor 67, was interposed. Circuit operation was started by turning on the 1480 nm laser, thus illuminating the photogenerator with 325 μW optical power. The arrow in FIG. 12 shows the point at which the circuit was activated. After several seconds delay, the shutter alternated between open and shut positions. The delay resulted primarily from charging a 10 μF capacitor used to regulate the voltage applied to the stepper motor circuit. Millisecond response times seem feasible. Optical crosstalk from 1480 nm light in the signal path, relative to the optical power at the photogenerator, was below −34 dB. Further improvement can be obtained using higher quality multiplexers, such as the state of the art devices used with erbium-doped fiber amplifiers.

Figure 13:
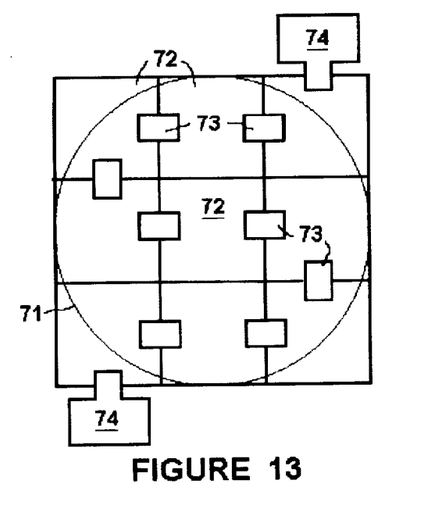
FIG. 13 is a diagram of the serially connected 3×3 photodetector array used to demonstrate the principles of the invention.
Figure 14:
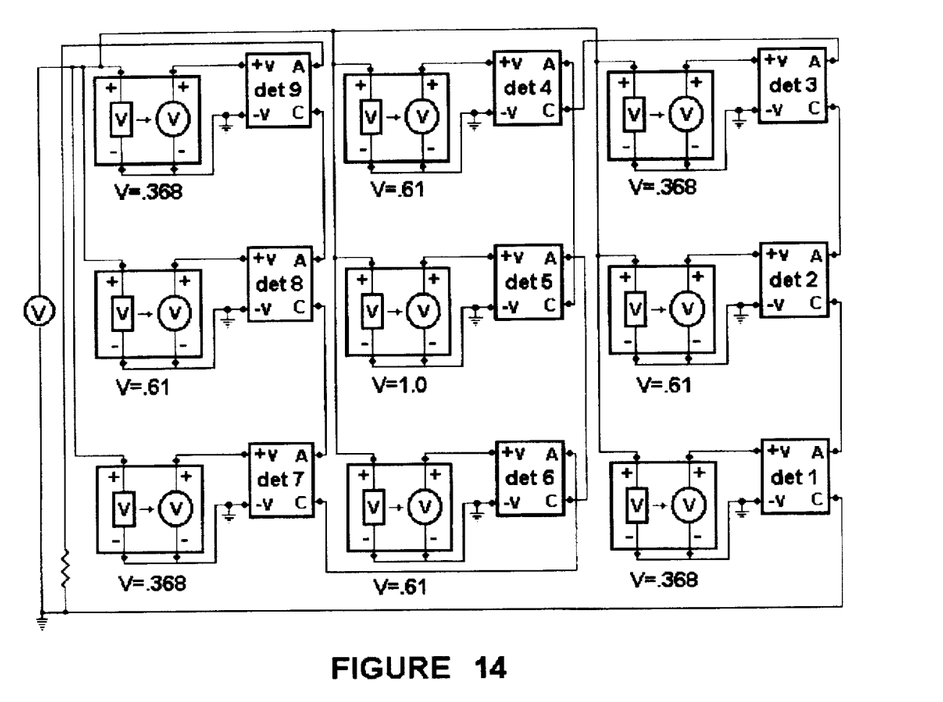
FIG. 14 is an equivalent electrical circuit representing the photodetector array of FIG. 13.

With a typical circular shaped optical beam the individual diodes in the diode array described in connection with FIG. 10 have different levels of illumination, or different fill factors due to the geometry of the array. This is illustrated in FIG. 13, with the beam designated 71 and the diodes in the 3×3 array designated 72. The interconnect metallization is shown at 73 and the bonding pads for the array at 74. The light incident on the diodes at the corners of the array is less than that for the center diode and the intermediate diodes. The illuminated areas on the center diode and the intermediate diodes is also not equal. In addition to the inequality of illuminated areas the level of illumination decreases from the center of the array to the edges of the array due to the gaussian distribution of the light flux across the beam. These inequalities reduce the efficiency of operation of the diode array because the total array current is limited to the current of the least productive diodes, in this case the diodes in the corners. The inequalities are shown electrically in the equivalent electrical circuit of FIG. 14. Here the nine diodes in the array are represented electrically, and designated "det 1-9". The voltage V is directly proportional to the light intensity on each detector diode.

Figure 15:
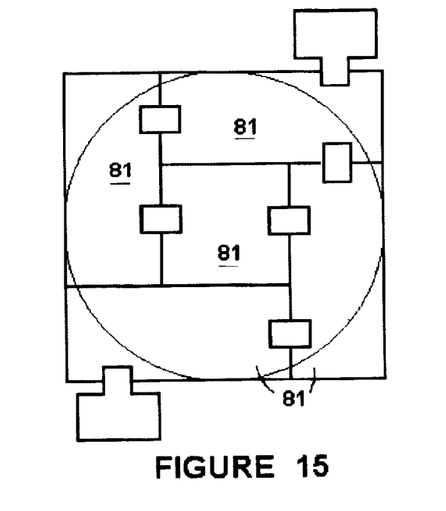
FIG. 15 is a diagram similar to that of FIG. 13 showing an alternative electrode arrangement for equalizing the photocurrent from each photodetector to improve the efficiency of the array.

One way of addressing the inequality problem just discussed is shown in FIG. 15. Here the diodes 81 in the array are geometrically configured to have approximately the same light intensity on each diode. This configuration is given as one example of a very large number of alternative configurations that will occur to those skilled in the art to produce the desired result, i.e. that each detector yield approximately the same photocurrent when illuminated with the output of an optical fiber. It is recommended for this invention that the maximum variation in the photogenerated current from the individual photodetector elements in the array be less than 25%.

The theoretical performance of this array is obtained from the simple diode model. With N equaling the number of array elements, $I_L$ the load current, and $V_L$ the load voltage, the minimum required optical power at the photogenerator, assuming complete filling and equal illumination of all the array elements is:

$$P_{optical} = \frac{N}{\eta} \left( I_s \left( \exp\left(\frac{V_L}{NnkT}\right) - 1 \right) + I_L \right)$$

As indicated earlier, the 3×3 array was chosen to yield a desirable voltage level in spite of the uneven fill factor drawback. Those skilled in the art will recognize that a 2×2 array gives an intrinsically equal fill factor, but a 2×2 array of long wavelength photodetectors will generally not provide the desired voltage levels. An option is to use silicon as the photodiode material. Adequate voltages are easily obtained with silicon diodes but the power wavelength must be below 950 nm. These shorter wavelengths may be useful in less demanding applications, but the higher attenuation of the optical fiber at these wavelengths will reduce the overall efficiency of these systems well below optimum. Thus for the purposes of this invention we prefer to use power wavelengths greater than 950 nm to avoid power loss in the fiber, and arrays of more than four detectors to achieve the desired voltage levels.

In practice it is difficult to obtain an ideal fill factor since the photodetector elements must be electrically isolated to be series connected. Moreover, the electrical contacts are typically made to the surface of the diodes and further reduce the active areas. Transparent electrode materials, such as indium tin oxide, are useful with some diode materials but are not effective with long wavelength diode arrays. Techniques and designs may become available in which the fill factor approaches ideal but with the current state of the art a reasonable goal for high performance array design is a fill factor of at least 40%. This means that at least 40% of the available optical power in the beams is incident on active areas of the array.

Generally speaking, typical dimensions of a useful array according to the invention will be substantially larger than the output beam, i.e. core, of the optical fiber supplying the power signal. The beam is expanded so a larger photodiode array area can be illuminated. Typical single mode fiber cores are of the order of ten microns in diameter. The array used to demonstrate the invention was about 1200 microns across and the beam covered the array. More efficient arrangements can be envisioned in which the array is smaller and more compact, reducing the dead spaces between the array elements and providing a more efficient fill factor. It is recommended that the array have a maximum dimension, measured in the major plane of the array, in the approximate range 2–120 times the fiber core diameter, typically 20–1200 microns.

Figure 16:
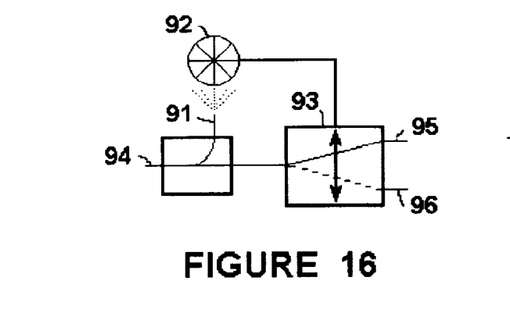
FIGS. 16–24 are schematic representations of several system applications for the photogenerator of the invention.

Several of these applications are illustrated schematically in FIGS. 16–24. FIG. 10 illustrated the embodiment where the photogenerator powered a simple shutter. The shutter could also be an attenuator or filter. FIG. 16 shows a remote receiving station where the demultiplexed power beam 91 powers photogenerator 92, which in turn actuates a 1×2 optical switch 93 to switch the signal beam on fiber 94 to either fiber 95 or 96.

The shutter of FIG. 10 and the optical switch of FIG. 16 are examples of devices powered by a micro-power stepper motor powered in turn by the photogenerator of the invention. Other devices, such as silicon micromechanical mirrors, liquid-crystal or electro-absorption modulators, and electro-optic or opto-mechanical polarization controllers could also be powered according to the invention. Short-burst operation of high-power circuits including laser transmitters would require storing electrical power in capacitors. Opto-mechanical devices powered by the photogenerator include linearly or rotationally actuated devices, one example of the latter being a filter wheel or variable attenuator.

Figure 17:
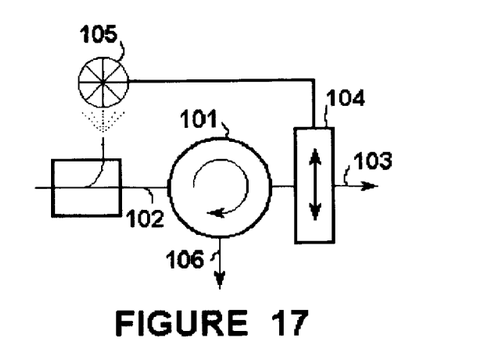

FIG. 17 is an optical circuit with a 3-port optical circulator 101 where the signal on fiber 102 is either transmitted directly through the circulator to output fiber 103 or is reflected by opto-mechanical reflector 104 back into the circulator and to alternative port 106. The state of the reflector is changed by power derived from photogenerator 105.

Figure 18:
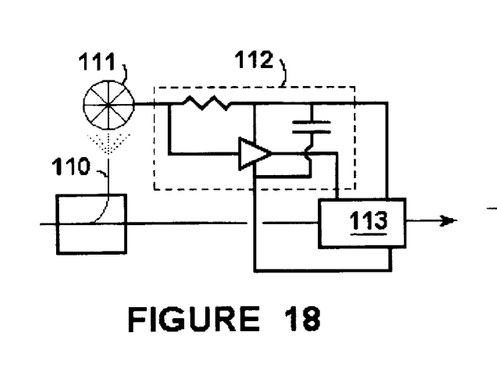

As shown in FIG. 18, the photogenerator can be used to not only for power at the remote station but also to receive signals that control actions at the remote node. In this case the optical beam for the power is modulated to contain signal information. The modulated power signal 110 is tapped, and detected by photogenerator 111. The modulated electrical signal from the photogenerator drives electronic circuitry 112 to not only power apparatus 113 but control its operation.

Figure 19:
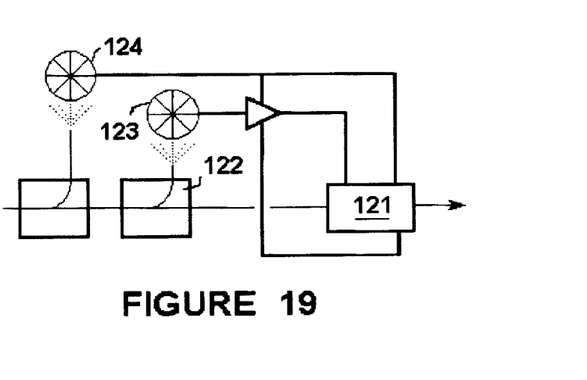
Figure 20:
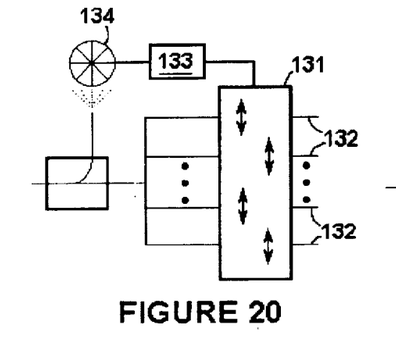

An alternative arrangement is shown in FIG. 19 where the apparatus 121 at the remote station is controlled by a separate optical control signal tapped from second demultiplexer 122. The optical signals from the second multiplexer are converted by photogenerator 123 to control signals for the apparatus 121. Power is supplied to apparatus 121 by the power generator 124 as in the earlier examples.

Processing telemetry or control signals at the remote station in a micro-power microcontroller enables higher functionality, including the powering and control of multiple devices. For example, in FIG. 20 an array of optical shutters or attenuators 131 is placed in the N output branches 132 of a 1-by-N optical splitter (N equals four in the example shown). The array is controlled and powered by microcontroller 133 with power and control signals converted from the remotely transmitted signal by photogenerator 134. In an access network where each output branch is connected to a subscriber's optical network unit (ONU), these shutters or attenuators would control subscriber service or increase the network's dynamic range.

Figure 21:
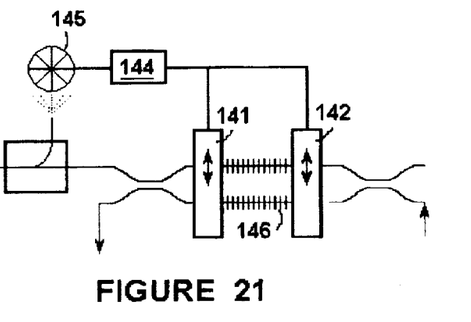

Another application in which the remotely powered photogenerator of the invention is useful is an enhanced fiber-grating-based optical add/drop multiplexer operating at two or more wavelengths, as shown in FIG. 21. Here, two optical shutters 141 and 142 are independently controlled by microcontroller 144, using power and control signals from the photogenerator 145 to add and drop wavelengths at the gratings 146 to reconfigure or redirect signals at the remote node. An advantageous use of this device is in reconfigurable branching units for undersea WDM networks where electrical service is costly.

Figure 22:
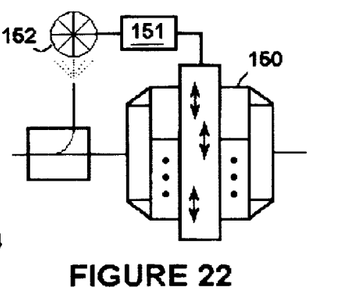

Another remote node useful for WDM networks is shown in FIG. 22, and is based on an add/drop multiplexer or channel selective WDM equalizer 150 based on arrayed-waveguide grating routers. The apparatus 150 is controlled by microcontroller 151 and remotely powered by photogenerator 152.

Figure 23:
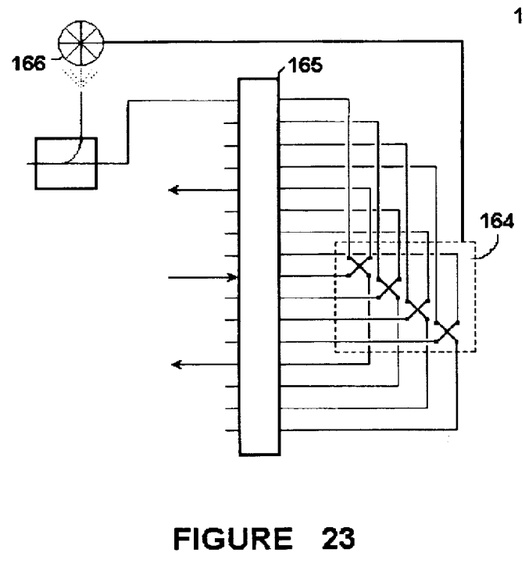

Increased functionality is shown in FIG. 23 which is a 2×2 crossconnect switch 164 based on a 16×16 arrayed waveguide grating router 165 that routes four wavelengths to either of two output ports. Four 2×2 optical switches are powered by the photogenerator 166, and reduced crosstalk is achieved by alternating the directions of input and output ports on the single router.

Figure 24:
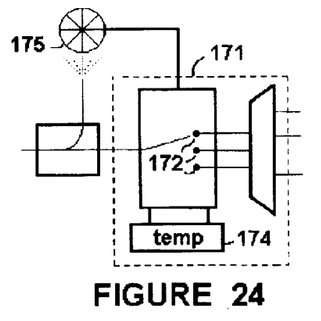

The final example of a remote node using a photogenerator according to the invention is shown in FIG. 24 where WDM router 171 is designed to counteract temperature-induced shift of the channel passbands. The temperature-tracking router has several input ports 172 that are selected with temperature changes to align the passbands of the output ports with their respective channels. A temperature sensor 174 at the remote node is monitored by the control circuitry to determine the proper switch state. The apparatus is powered by photogenerator 175.

Figure 25:
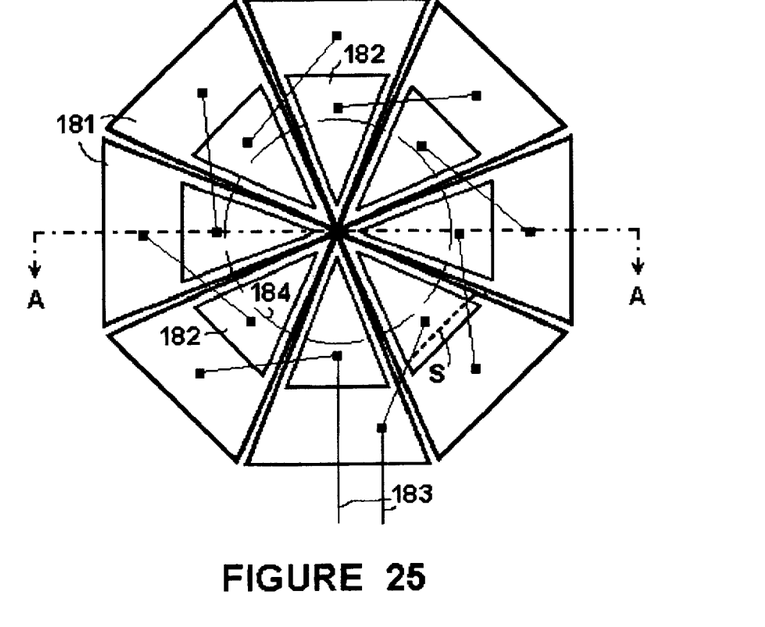
FIG. 25 is a schematic plan view of a preferred embodiment of the photodetector array of the invention.

An alternative detector array which offers intrinsically uniform fill factors as well as equal output current for each element of the array is shown in plan view in FIG. 25. This is the preferred embodiment of the invention and is representative of array geometries that are shaped to the beam spot and have essentially circular symmetry. A circularly symmetric array is one in which the mirror images from two diagonals of the array at 90° essentially match the original image. The array of FIG. 25 is comprised of segments of a polygon 181. The smaller triangles 182 are the p-i-n junction regions. The base of the larger segments 181 are of one conductivity type and the segments 182 the other. Electrical interconnections 183 are made between the n- and p- regions as shown to provide a serially connected array. The interconnections are shown as lines for simplicity in the illustration. Typically the interconnects are patterns of metallization as known to those skilled in the art. An optical beam profile is shown at 184. As is evident the space between the segments 182 and the space at the center of the array reduce the fill factor and should be minimized.

One of the segments of the array of FIG. 25 is shown in greater detail as a cross section through the section line designated "S" in FIG. 25. The array may be fabricated using conventional processing steps and a variety of fabrication approaches. Our approach was to form the five layer structure shown in FIG. 26, then pattern it to give the array geometry shown in FIG. 25. The processing details are as follows.

Substrate 191 is insulating or semi-insulating. In our structure the substrate material was iron-doped InP. The five layers 192–196 were grown using standard low pressure Metal Organic Vapor Phase Epitaxy (MOVPE) techniques. These standard techniques are described in "Materials Aspects of GaAs and InP Based Structures", Swaminadhan & Macrander, pp. 131–165, Prentice Hall, Inc., 1991; "Reduction of Base-Collector Capacitance By Undercutting the Collector and Subcollector in GaAs/InP DHBT's", Y. Miyamoto et al, IEEE Electron Device Letters, 17, pp. 97–99, 1996. Referring again to FIG. 26, the first deposited layer, 192, is the n-layer of the p-i-n structure and consists of silicon-doped InGaAs. Layer 193 is undoped InP and provides a stop etch for the pattern defining sequence. Layer 194 is the absorbing layer and consists of intrinsic InGaAs. The p-layer 195 in the structure must be essentially transparent to the optical wavelength, typically 1.3–1.55 microns. In our structure the p-layer was zinc-doped InP. The p+ contact layer 196 is zinc-doped InGaAs. To minimize zinc diffusion from the zinc-doped InP layer into the intrinsic InGaAs layer the first three layers were grown at 625° C. while the last two layers were grown with the temperature lowered to 590° C. The InGaAs layer composition was adjusted to be lattice matched at the growth temperature and the background doping level in the i-layer was $N=2\times10^{15}$ $cm^{-3}$.

In patterning the five layers just described to define the segments of the array of FIG. 25 we used conventional photolithographic techniques. First, we etched through the p- and i- layers by Reactive Ion Etching (PIE) and selective chemical etching, to define the active segments, or p-i-n diodes, 182 (FIG. 25). Next the individual segments 181 were isolated by masking and etching through the n+ InGaAs layer, again by a combination of PIE and selective chemical etching. We have chosen to use PIE instead of all chemical etching to reduce the undercut of the masks, and maintain the narrow channels (>2 µm) between diode segments since any increase in channel width reduces the fill factor of the array. Next, the p- and n-contact metals were deposited by evaporation, followed by the application of an ~3 µm thick polyimide layer over the whole wafer. Windows were opened in the polyimide by PIE for the interconnect metallization, and the interconnect metal was deposited using a lift-off technique. The wafer was thinned to 100 µm and sawed into 500×500 µm chips. The photogenerator chips were mounted on a suitable mount and packaged in a conventional lightwave package.

Figure 26:
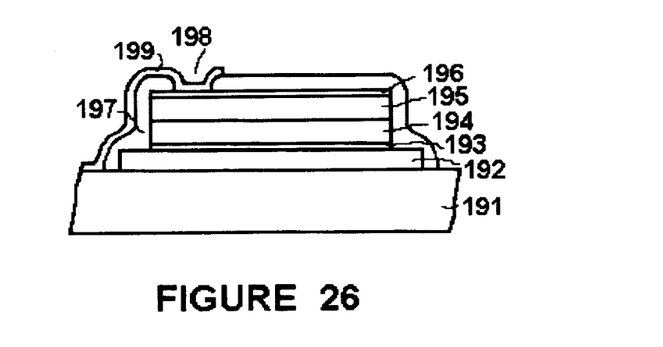
FIG. 26 is a sectional view through one of the segments in the array of FIG. 25.
Figure 27:
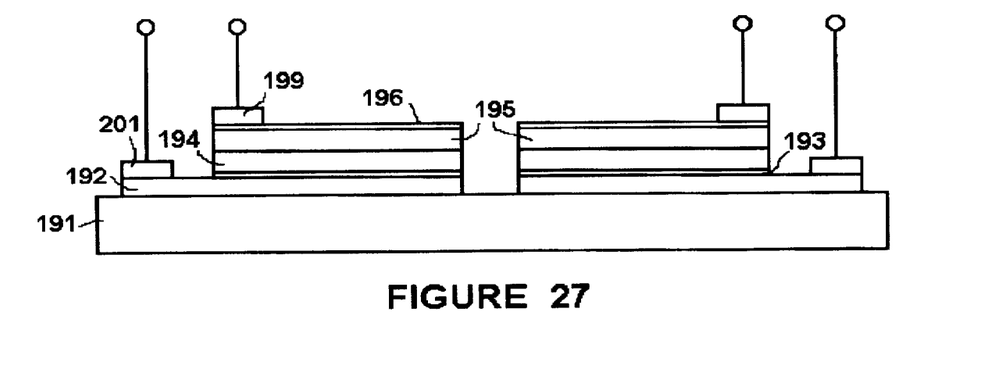
FIG. 27 is a sectional view through the whole array of FIG. 25.

The section A—A in FIG. 25 is shown in FIG. 27. The contacts are shown schematically for simplicity. The reference numbers correspond to those in FIG. 26 except for contact 201 which does not appear in FIG. 26.

Figure 28:
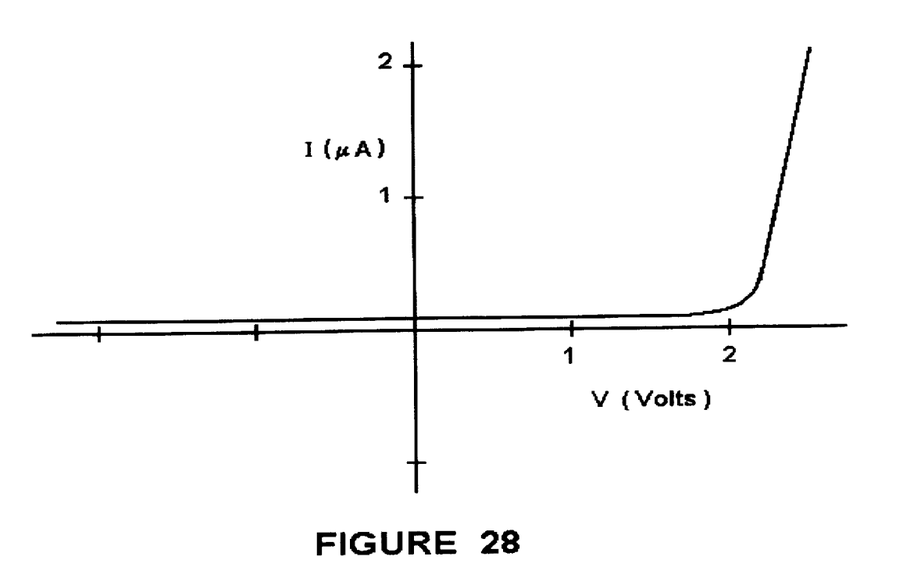
FIG. 28 is an I-V curve for the array of FIGS. 25–27.
Figure 29:
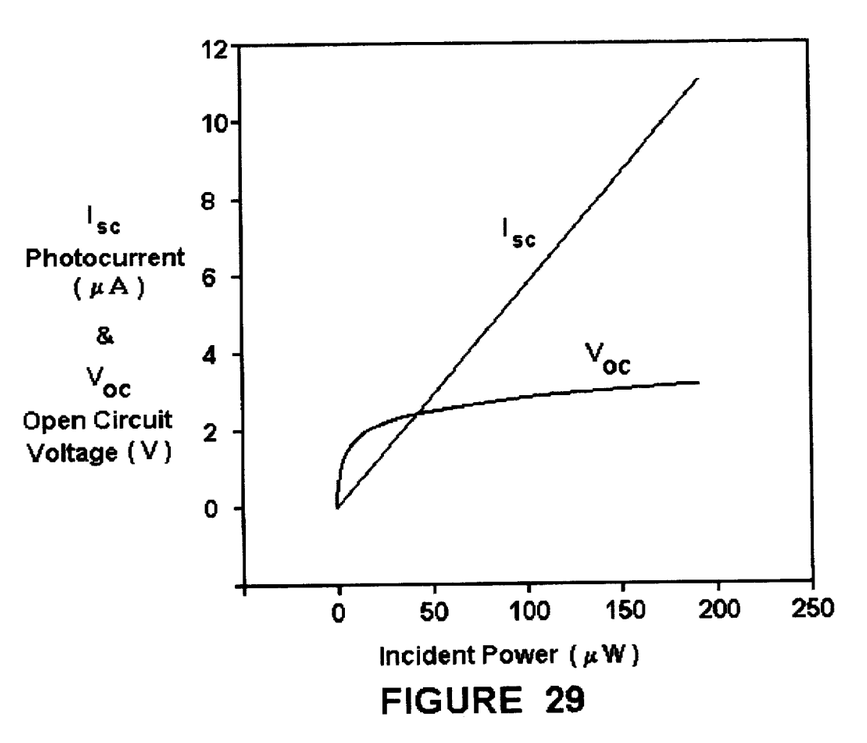
FIG. 29 is a plot of Incident Power vs. Photocurrent (Isc) and Open Circuit Voltage (Voc) for the array of FIGS. 25–27.

The I-V characteristic of the eight-segment photogenerator is shown in FIG. 28. The device shows a forward bias of 2.1 V as expected for the eight serially connected diodes. The relatively high resistance (300 to 1000 ohm) indicated by the I-V curve probably originates from the interconnect metallization or contact, since the individual p-i-n segments have resistances below 10 ohm. The shunt current between the diode segments is below 100 pA at 2V, and the saturation current (the current at which the saturation voltage of 2.1 V was obtained) is 1 µA. The spectral response of the photogenerators is indistinguishable from that of a conventional InGaAs photodiode, i.e., it is essentially flat from 1.0 to 1.65 min. We measured the diode capacitance to be 60 fF, as expected for the eight serially connected segments. The optical vs. electrical power plot is shown in FIG. 29. The geometrical fill factor of the present devices is 49% and the 1 dB alignment tolerance should allow passive alignment techniques to be used in packaging these devices with input fibers.

While the array design we chose to demonstrate the invention was an octagon, polygons with greater or fewer segments can be employed to advantage as well. Also a circular, pie-shaped array with each element shaped like a piece or segment of the pie matches the beam diameter even slightly better than the array of FIG. 25. In the case of the polygon shaped array each element or segment has a triangle shape. With a circular shaped array each element or segment can be defined as having a sector shape. In the array of FIG. 25 the array comprises a first array of N triangular shaped n-type semiconductor bodies 181, and a second array of N triangular p-type semiconductor bodies 182 overlying the first array of triangular bodies to form photojunctions. In the example shown, N equals eight. The second array of triangular shaped bodies are shown with a smaller height and slightly smaller base. The smaller height was chosen to provide a convenient site on the surface of the first array for the electrical interconnection. However, the structure could be designed with triangular bodies of essentially the same size and shape for both the p- and the n- layers.

Arrays may have odd or even numbers of elements. In general, arrays with 6-16 segments would appear to be the most likely design choice. The optimum number of elements in the array depends on many factors which will be discussed below.

The optimum overall geometry and the size of the photogenerator array are functions of the application, the required electrical and optical performance, and cost. Especially useful applications, and thus our preferred applications, are those requiring 1-2 volts, or more, operating voltage with currents less than 100 microamperes and the ability to reach operating power levels within 100 microseconds or, if used for control signals, the ability to receive 10 kBits/sec signal bandwidth. These requirements place restrictions on some device parameters, as listed in the following Table for the example of an 8-sector circular photogenerator. These are shown in the following Table.

TABLE 1

| Parameter | Range | Constraint | Array Size |
| --- | --- | --- | --- |
| Feature size (etching) | >4 microns | Optical fill factor >~ 40% | Increase |
| Isolation | >1 Mohm | Shunted A < 0.5 microA | Increase |
| Saturation current, Is | <10 nA (approx.) | Vout > 2 V at 1 microA | Decrease |
| Photocurrent limit | >100 microamp | Circuit requirements | Increase |
| Transverse misalign. | >2.5 microns | Photocurrent loss < 1d | Increase |
| Capacitance | <16 pF | 10 kbits/s into 10 Mohm | Decrease |
| Conversion efficiency | >0.5 A/W | High device efficiency | — |
| Contact resistance | <1 kohm | Voltage drop < 0.1 V | Increase |
| Cost | — | Minimize | |

These objectives were substantially met with the array design of FIG. 25 and 26 in which the diameter of the active region was 65 microns and the overall diameter of the larger segment array was 130 microns. Estimates of the fill factor (the fraction of light captured) and alignment tolerance were obtained from numerical integration of the intensity profile intercepted by the array. A gaussian intensity profile is assumed for light coming out of a cleaved-end delivery fiber. The fill factor for the array is calculated as:

$$F = 2N \int_{x_{min}}^{x_{max}} \int_{0}^{s(x_{max}-x_{min})} \frac{\exp(-(x^2+y^2)/\omega_o^2)}{\pi \omega_o^2} \, dy dx$$

Other options yielding a circular symmetry like the array of FIG. 25 will occur to those skilled in the art. For example, concentric rings of diodes arranged in a circular pattern fall within the definition of circularly symmetric but these would require tailoring the diode shapes from ring to ring to account for the diminished beam intensity from the inner ring to the outer ring or rings. The most effective and therefore preferred detector configuration is one in which all detectors have the same size and shape, and arrayed with circular symmetry, so that an optical beam with the center of the beam aligned on the point of circular symmetry of the detector array gives equal optical intensity on each element of the array.

The circularly symmetric array just described was a mesa structure integrated on a semi-insulating substrate. Techniques may be developed to fully integrate arrays in an isoplanar configuration. For example, dielectric isolation techniques like those used in power devices may be employed. Junction isolation is another choice that allows for planar structures with high packing density, i.e. less dead space in the illuminated area.

The remote power systems detailed above are described as useful to operate mechanical and optical equipment. The term "electrically operated apparatus" is meant to include these and other forms of apparatus for which these remote power systems can be used to advantage.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. In a lightwave system comprising a sending station and a terminal station, at least one optical fiber end connecting the sending station with the terminal station, said optical fiber having an optical beam input end at the sending station and an optical beam output end at the terminal station, a power laser light source at the sending station connected to said at least one optical fiber for launching an optical beam through said optical fiber, an electrically operated electromechanical or electrooptic apparatus at the terminal station, a photodetector at the terminal station with the electrical output of the photodetector connected to said electrically operated apparatus, and means for directing the optical beam from the output end of the optical fiber onto the photodetector, said photodetector comprising at least four photodiodes, said photodiodes having the same size and shape, the shape of the photodiodes being essentially sectors of a polygon or circle, with the photodiodes arrayed to form a circle or polygon, and with the photodiodes electrically connected in series so that the voltage output of the photodiode array is the sum of the voltages of the individual photodiodes.

2. The system of claim 1 in which said electrically operated electromechanical or electrooptic apparatus operates at a voltage of greater than one volt and each of said at least four photodiodes have an output voltage of less than one volt.

3. The system of claim 1 in which the photodetector comprises an array of photodiodes operating at an optical wavelength of greater than 950 nm.

4. The system of claim 1 in which the electrically operated apparatus operates at a voltage of at least 0.8 volts.

5. The system of claim 1 in which the optical fiber is a single mode fiber.

6. The system of claim 5 in which the optical fiber has a core diameter of the order of 10 microns or less.

7. The system of claim 1 in which the photodiode array of the photodetector has a maximum dimension, as measured in the major two dimensional plane of the array, in the range of 2–120 times the fiber core diameter.

8. The system of claim 1 in which the photodiode current response from the individual photodiodes in the array varies by less than about 25%.

9. The system of claim 1 in which the fill factor of the photodiode array is greater than approximately 40%.

10. The system of claim 1 further including multiplexer means at the sending station and demultiplexer means at the terminal station, means for launching an optical communications signal through said multiplexer into the input end of said optical fiber, and through said demultiplexer at the terminal station said optical communications signal having a light frequency different from the frequency of said laser source.

11. The system of claim 1 in which the photogenerator comprises a polygon-shaped array of at least six photodetectors.

12. The system of claim 1 in which the array comprises at least six photodiode segments and has a circular shape.

13. The system of claim 11 in which the array comprises eight photodiode segments and has an octagon shape.

14. A photodiode array comprising:

an insulating or semi-insulating substrate, a first array of N triangular-shaped semiconductor regions on the substrate, said triangular-shaped semiconductor regions arranged to form a polygon, said semiconductor regions being of a first conductivity type and further being electrically isolated from each other, a second array of N triangular-shaped semiconductor regions of intrinsic semiconductor overlying the first triangular-shaped regions and essentially congruent therewith, said second triangular-shaped semiconductor regions having a triangular shape with a base and height equal to or less than the base and height of the first triangular-shaped semiconductor regions, a third array of N triangular-shaped semiconductor layers with a conductivity type opposite to that of the first conductivity type overlying the second array of triangular-shaped semiconductor regions with the same shape and approximate size as the second array thus forming an array of N p-i-n photodiodes, and means for electrically connecting the N p-i-n photodiodes serially together.

15. The photodiode array of claim 14 further including an optical fiber with the center of the core of the optical fiber positioned to illuminate the center of the said polygon, and with the output beam of said optical fiber illuminating essentially all of said polygon.

16. The photodiode array of claim 14 in which N is in the range 6–16.

17. A photodiode array comprising:

an insulating or semi-insulating substrate, a first array of N sector-shaped semiconductor regions on the substrate, said sector-shaped semiconductor regions arranged to form a circle, said semiconductor regions being of a first conductivity type and further being electrically isolated from each other, a second array of N sector-shaped semiconductor regions of intrinsic semiconductor overlying the first sector-shaped regions and essentially congruent therewith, said second sector-shaped semiconductor regions having a shape essentially the same as the first sector-shaped semiconductor regions, and a size equal to or smaller than the first sector-shaped semiconductor regions, a third array of N sector-shaped semiconductor layers with a conductivity type opposite to that of the first conductivity type overlying the second array of sector-shaped semiconductor regions with the same shape and approximate size as the second array thus forming an array of N p-i-n photodiodes, and means for electrically connecting the N p-i-n photodiodes serially together.

18. The photodiode array of claim 17 further including an optical fiber with the center of the core of the optical fiber positioned to illuminate the center of said circle and the output beam of said optical fiber illuminating essentially all of said circle.

* * * * *